US009865538B2

(12) United States Patent
Adusumilli et al.

(10) Patent No.: US 9,865,538 B2
(45) Date of Patent: Jan. 9, 2018

(54) METALLIC BLOCKING LAYER FOR RELIABLE INTERCONNECTS AND CONTACTS

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/065,226

(22) Filed: Mar. 9, 2016

(65) Prior Publication Data

US 2017/0263547 A1 Sep. 14, 2017

(51) Int. Cl.
*H01L 23/528* (2006.01)
*H01L 23/522* (2006.01)
*H01L 23/532* (2006.01)
*H01L 21/768* (2006.01)

(52) U.S. Cl.
CPC ...... *H01L 23/528* (2013.01); *H01L 21/76816* (2013.01); *H01L 21/76843* (2013.01); *H01L 21/76879* (2013.01); *H01L 23/5226* (2013.01); *H01L 23/53228* (2013.01); *H01L 23/53261* (2013.01); *H01L 23/53266* (2013.01)

(58) Field of Classification Search
CPC ............. H01L 23/528; H01L 21/76816; H01L 21/76843; H01L 21/76879
See application file for complete search history.

(56) References Cited

U.S. PATENT DOCUMENTS

| 6,326,306 | B1 | 12/2001 | Lin |
| 6,475,909 | B2* | 11/2002 | Uozumi ................. C23C 22/63 257/E21.584 |
| 6,528,409 | B1* | 3/2003 | Lopatin ................. H01L 21/288 257/E21.174 |
| 7,569,475 | B2 | 8/2009 | Yang et al. |
| 7,727,888 | B2 | 6/2010 | Yang et al. |

(Continued)

FOREIGN PATENT DOCUMENTS

WO  2006059261 A2  6/2006

OTHER PUBLICATIONS

Anonymous, "Hybrid Barrier Structure for Damascene Cu Interconnect", IPCOM000238189D, Aug. 7, 2014, 3 pages.

*Primary Examiner* — Errol Fernandes
(74) *Attorney, Agent, or Firm* — Scully, Scott, Murphy & Presser, P.C.; Daniel P. Morris, Esq.

(57) ABSTRACT

A semiconductor structure is provided that includes a first interconnect dielectric layer containing a first interconnect metal structure embedded therein. A second interconnect dielectric layer containing a second interconnect metal structure embedded therein is located atop the first interconnect dielectric layer. A metallic blocking layer is present that separates a surface of the second interconnect metal structure from a surface of the first interconnect metal structure. The metallic blocking layer has a lower resistivity than the first and second interconnect metal structures. The metallic blocking layer prevents electromigration of metallic ions from the first and second interconnect metal structure.

11 Claims, 4 Drawing Sheets

(56) References Cited

U.S. PATENT DOCUMENTS

| | | |
|---|---|---|
| 8,232,646 B2 | 7/2012 | Bonilla et al. |
| 2007/0077761 A1 | 4/2007 | Lehr et al. |
| 2014/0048927 A1 | 2/2014 | Burke et al. |
| 2014/0124933 A1 | 5/2014 | Yang et al. |
| 2014/0239503 A1 | 8/2014 | Huisinga et al. |

* cited by examiner

METALLIC BLOCKING LAYER FOR RELIABLE INTERCONNECTS AND CONTACTS

BACKGROUND

The present application relates to a semiconductor structure and a method of forming the same. More particularly, the present application relates to an interconnect structure that contains a metallic blocking layer which prevents ion flow of interconnect metals to enable acceptable electromigration performance. The present application also relates to a method of forming such an interconnect structure.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure, which may also be referred to as an interconnect structure, typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

As the interconnect structure feature sizes shrink, it is necessary to scale barrier (e.g., TaN) thickness in order to maximize Cu volume and to enable a low line and via resistance. Scaling sidewall barrier thickness allows maximization of Cu volume in interconnect structures, and scaling barrier thickness at the via bottom allows reduction of via resistance.

Reliability, in particular electromigration performance, is negatively impacted as the diffusion barrier thickness is scaled. In addition to risks associated with diffusion barrier continuity on sidewalls, discontinuities in the diffusion barrier at the via bottom can lead to breakdown of the "short-length" criterion. This criterion requires blocking of Cu ion flow at the via bottom in order to prevent massive Cu migration from level to level. Hence, there is a need for providing an interconnect structure containing no diffusion barrier, yet containing a means for blocking Cu ion (or other metallic ion) migration from one level to another level.

SUMMARY

In one aspect of the present application, a semiconductor structure (i.e., interconnect structure) is provided. In one embodiment of the present application, the semiconductor structure includes a first interconnect dielectric layer containing a first interconnect metal structure embedded therein. A second interconnect dielectric layer containing a second interconnect metal structure embedded therein is located atop the first interconnect dielectric layer. In accordance with the present application, a metallic blocking layer is present that separates a surface of the second interconnect metal structure from a surface of the first interconnect metal structure. The metallic blocking layer that is employed in the present application has a lower resistivity than the first and second interconnect metal structures. The metallic blocking layer prevents electromigration of metallic ions from the first and second interconnect metal structures and thus is more reliable than conventional interconnect structures not containing the metallic blocking layer.

In another embodiment of the present application, a method of forming an interconnect structure is provided. In one embodiment, the method of the present application includes forming a second interconnect dielectric layer atop a first interconnect dielectric layer containing a first interconnect metal structure embedded therein. Next, an opening is formed in the second interconnect dielectric layer, the opening exposes a portion of the first interconnect metal structure. A metallic blocking layer is then provided within a lower portion of the opening and directly upon the exposed portion of the first interconnect metal structure. Next, a second interconnect metal structure is formed in the opening and embedded within the second interconnect dielectric layer, wherein the metallic blocking layer has a lower resistivity than the first and second interconnect metal structures.

DETAILED DESCRIPTION

Figure 1:
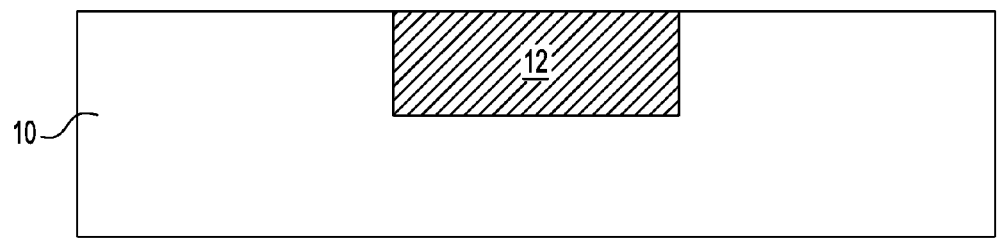
FIG. 1 is a cross sectional view of an exemplary semiconductor structure including a first interconnect dielectric layer containing at least one first interconnect metal structure embedded therein in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary semiconductor structure including a first interconnect dielectric layer 10 containing at least one first interconnect metal structure 12 embedded therein in accordance with an embodiment of the present application. The exemplary semiconductor structure shown in FIG. 1 may be located on a surface of an underlying substrate (not shown in the drawings of the present application). Collectively, the first interconnect dielectric layer 10 containing the at least one first interconnect metal structure 12 embedded therein provides an interconnect level of the interconnect structure of the present application.

The substrate, which is not shown, may be composed of a semiconductor material, an insulator material, a conductive material or any combination thereof. When the substrate is composed of a semiconductor material, any semiconductor material such as Si, SiGe, SiGeC, SiC, Ge alloys, III/V compound semiconductor or II/VI compound semiconductors may be used. In addition to these listed types of semiconductor materials, the present application also contemplates cases in which the semiconductor substrate is a layered semiconductor such as, for example, Si/SiGe, Si/SiC, silicon-on-insulators (SOIs) or silicon germanium-on-insulators (SGOIs). When the substrate comprises a semiconducting material, one or more semiconductor devices such as, for example, complementary metal oxide semiconductor (CMOS) devices can be fabricated thereon.

When the substrate is an insulator material, the insulator material can be an organic insulator, an inorganic insulator or a combination thereof including multilayers. When the substrate is a conductive material, the substrate may include, for example, polySi, a conductive metal, alloys of at least two conductive metals, a metal silicide, a metal nitride or combinations thereof including multilayers. When the substrate is composed of a combination of an insulator material and a conductive material, the substrate may represent a lower interconnect level of a multilayered interconnect structure, and the exemplary semiconductor structure shown in FIG. 1, may provide components of an upper interconnect level of the multilayered interconnect structure.

The first interconnect dielectric layer 10 may be composed of any interlevel or intralevel dielectric material including inorganic dielectric materials, organic dielectric materials or combinations thereof. The first interconnect dielectric layer 10 may be entirely porous, entirely non-porous, or it can contain regions that are porous and other regions that are non-porous. Some examples of suitable dielectric materials that can be used as the first interconnect dielectric layer 10 include, but are not limited to, $SiO_2$, silsesquioxanes, C doped oxides (i.e., organosilicates) that include atoms of Si, C, O and H, thermosetting polyarylene ethers, or a multilayered stack thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first interconnect dielectric layer 10 typically has a dielectric constant that is about 4.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the first interconnect dielectric layer 10 may vary depending upon the dielectric material used as well as the exact number of dielectric materials that provides the first interconnect dielectric layer 10. Typically, and for normal interconnect structures, the first interconnect dielectric layer 10 has a thickness from 50 nm to 1000 nm. Other thicknesses that are lesser than, or greater than, the aforementioned thickness can also be used as the thickness of the first interconnect dielectric layer 10.

As mentioned above, the first interconnect dielectric layer 10 includes at least one least one first interconnect metal structure 12 embedded therein. By "embedded" it is meant that a first structure/material is contained within a second structure/material such that at least the sidewalls of the second structure/material surround sidewalls of the first structure/material. As is shown, a topmost surface of the at least one first interconnect metal structure 12 is coplanar with a topmost surface of the first interconnect dielectric layer 10.

In some embodiments, and as shown, the bottommost surface of the at least one first interconnect metal structure 12 is in contact with a sub-surface of the first interconnect dielectric layer 10. By "sub-surface" it is meant a surface of the first interconnect dielectric layer 10 that is located between a topmost surface of the first interconnect dielectric layer 10 and a bottommost surface of the first interconnect dielectric layer 10. In another embodiments, the at least one first interconnect metal structure 12 extends entirely through the first interconnect dielectric layer 10. In some embodiments, a first set of first interconnect metal structures have a first depth, while a second set of first interconnect metal structures has a second depth that differs from the first depth.

In some embodiments (not shown), a diffusion barrier may be present between the first interconnect metal structure 12 and the first interconnect dielectric layer 10. In some embodiments, and as shown, no diffusion barrier is present between the first interconnect metal structure 12 and the first interconnect dielectric layer 10. When present, the diffusion barrier is U-shaped and has a topmost surface that is coplanar with a topmost surface of both the first interconnect metal structure 12 and the first interconnect dielectric layer 10. When present, the diffusion barrier may be composed of any diffusion barrier material such as, for example, Ta, TaN, Ti, TiN, Ru, RuN, RuTa, RuTaN, W, WN or any other material that can serve as a barrier to prevent conductive material from diffusing there through. The diffusion barrier can be formed utilizing any conventional deposition process including, for example, chemical vapor deposition or plasma enhanced chemical vapor deposition. The thickness of the diffusion barrier may vary depending on the deposition process used as well as the type of diffusion barrier material employed. Typically, the diffusion barrier has a thickness from 2 nm to 40 nm. Other thicknesses that are lesser than 2 nm, and greater than 40 nm may also be used as the thickness of the diffusion barrier.

The at least one interconnect metal structure 12 includes a conductive metal-containing. Illustrative example of conductive metal-containing materials that can be used to provide the at least one interconnect metal structure 12 include a conductive metal, an alloy comprising at least one conductive metal, a conductive metal silicide or combinations thereof. In one example, the conductive metal-containing material that is used in forming the at least one interconnect metal structure 12 is composed of Cu, W or Al or a Cu alloy.

The exemplary semiconductor structure of FIG. 1 can be formed utilizing conventional processing that is well known to those skilled in the art. For example, the exemplary semiconductor structure of FIG. 1 can be formed by first providing the first interconnect dielectric layer 10 on a surface of a substrate (not shown). The first interconnect dielectric layer 10 can be formed utilizing any conventional deposition process including, for example, chemical vapor deposition, plasma enhanced chemical vapor deposition or spin-on coating. After providing the first interconnect dielectric layer 10, an opening (via, line or combination thereof) can be formed into the first interconnect dielectric layer 10 utilizing lithography and etching. The opening is then lined with the optional diffusion barrier material, and thereafter filled with one of the above mentioned conductive metal-containing materials. A planarization process such, as for example, chemical mechanical polishing, can then be used to provide the exemplary semiconductor structure of FIG. 1.

Figure 2:
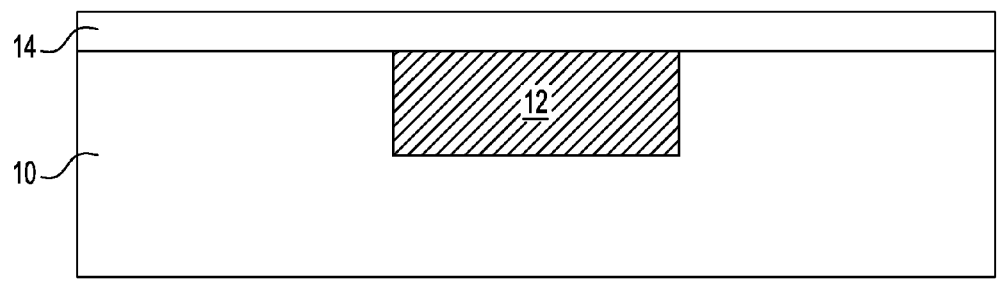
FIG. 2 is a cross sectional view of the exemplary semiconductor structure of FIG. 1 after forming a dielectric capping layer on the exposed surfaces of the first interconnect dielectric layer and the at least one first interconnect metal structure in accordance with an embodiment of the present application.

Referring now to FIG. 2, there is illustrated the exemplary semiconductor structure of FIG. 1 after forming a dielectric capping layer 14 on the exposed surfaces of the first interconnect dielectric layer 10 and the at least one first interconnect metal structure 12 in accordance with an embodiment of the present application. In some embodiments of the present application, the formation of the dielectric capping layer 14 can be omitted.

When employed and as is shown, the dielectric capping layer 14 is a contiguous layer that covers the entirety of the exemplary semiconductor structure shown in FIG. 1. The dielectric capping layer 14 is composed of any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the dielectric capping layer 14 may vary depending on the technique used to form the same as well as the material make-up of the layer. Typically, the dielectric capping layer 14 has a thickness from 15 nm to 100 nm, although other thicknesses are possible. The dielectric capping layer 14 can be formed utilizing any well known deposition process including chemical vapor deposition, plasma enhanced chemical vapor deposition or spin-on coating.

Figure 3:
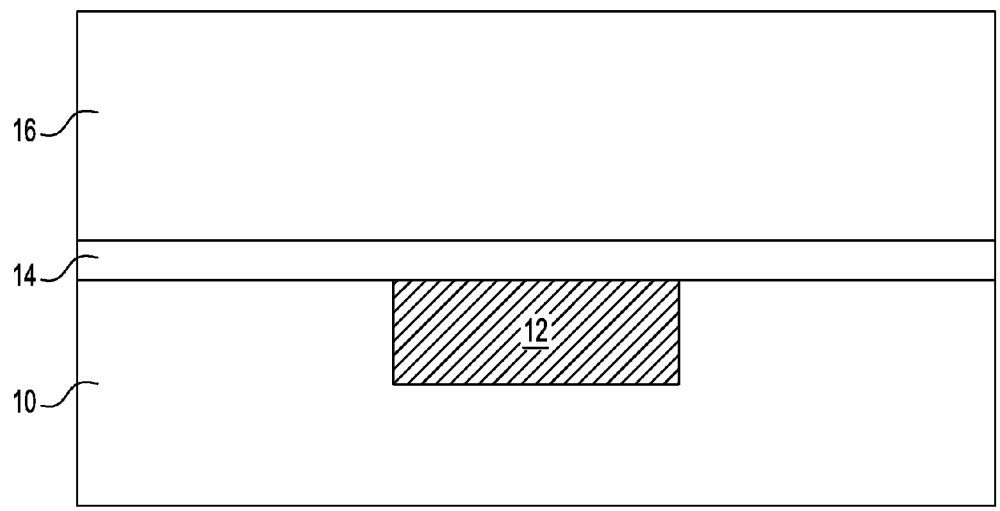
FIG. 3 is a cross sectional view of the exemplary semiconductor structure of FIG. 2 after forming a second interconnect dielectric layer on the dielectric capping layer in accordance with an embodiment of the present application.

Referring now to FIG. 3, there is illustrated the exemplary semiconductor structure of FIG. 2 after forming a second interconnect dielectric layer 16 on the dielectric capping layer 14 in accordance with an embodiment of the present application. In some embodiments (not shown), the second interconnect dielectric layer 16 is formed directly upon the exemplary semiconductor structure shown in FIG. 1.

The second interconnect dielectric layer 16 may include one of dielectric materials mentioned above for the first interconnect dielectric layer 10. In one embodiment of the present application, the dielectric material that provides the second interconnect dielectric layer 16 is the same dielectric material as that which provides the first interconnect dielectric layer 10. In another embodiment of the present application, the dielectric material that provides the second interconnect dielectric layer 16 is compositionally different from the dielectric material that provides the first interconnect dielectric layer 10. The second interconnect dielectric layer 16 may be formed utilizing any well known deposition process including, for example, chemical vapor deposition, plasma enhanced chemical vapor deposition or spin-on coating. The second interconnect dielectric layer 16 can have a thickness within the range mentioned above for the first interconnect dielectric layer 10.

In some embodiments (not shown), another dielectric capping layer may be formed atop the second interconnect dielectric layer 16 prior to further processing. The another dielectric capping layer that can be formed may include one of the materials mentioned above for the dielectric capping layer 14. In one embodiment of the present application, the material that provides the another dielectric capping layer is the same material as that which provides the dielectric capping layer 14. In another embodiment of the present application, the material that provides the another dielectric capping layer is compositionally different from the material that provides the dielectric capping layer 14. The another dielectric capping layer may be formed utilizing any well known deposition process including, for example, chemical vapor deposition, plasma enhanced chemical vapor deposition or spin-on coating. The another dielectric capping layer can have a thickness within the range mentioned above for the dielectric capping layer 14.

Figure 4:
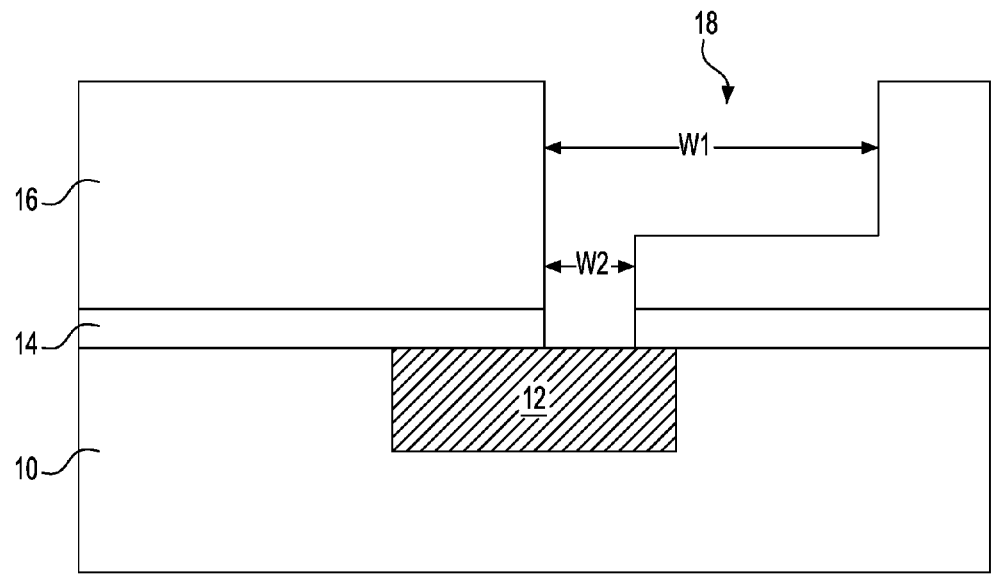
FIG. 4 is a cross sectional view of the exemplary semiconductor structure of FIG. 3 after forming at least one opening through the second interconnect dielectric layer and the dielectric capping layer to expose a portion of the topmost surface of the at least one first interconnect metal structure in accordance with an embodiment of the present application.

Referring now to FIG. 4, there is illustrated the exemplary semiconductor structure of FIG. 3 after forming at least one opening 18 through the second interconnect dielectric layer 16 and, if present, the dielectric capping layer 14 to expose a portion of the topmost surface of the at least one first interconnect metal structure 12 embedded in the first interconnect dielectric layer 10 in accordance with an embodiment of the present application.

The at least one opening 18 may be a via opening (not specifically shown), a line opening (not specifically shown), a combined line/via opening (as is shown) or any combination of such openings. As is known to the skilled in the art, via openings have a width that is less than line openings. This is depicted in FIG. 4 of the drawings, in which the line portion of the combined line/via opening has a first width, w1, and the via portion of the combined line/via opening has a second width, w2, wherein the second width is less than the first width. In one embodiment, the first width of the line portion of the combined line/via opening can be from 10 nm to 500,000 nm, while the second width of the via portion of the combined line/via opening can be from 5 nm to 50 nm.

The at least one opening 18 can be formed by a patterning process. In one embodiment, the patterning process may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. After etching, the patterned photoresist can be removed utilizing any photoresist stripping process such as, for example, ashing. A single patterning process can be used to from a via opening or a line opening. A combination of patterning processes can be used to form a combined line/via opening.

In one embodiment, the dielectric capping layer 14 may be opened utilizing the same etch as used to pattern the second interconnect dielectric layer 16. Alternatively, and in another embodiment of the present, the dielectric capping layer 14 may be opened utilizing a different etch as used to pattern the second interconnect dielectric layer 16. Although not shown, a diffusion barrier as described above may be formed within the at least one opening 18 prior to opening the dielectric capping layer 14. In cases in which no dielectric capping layer is employed and when a diffusion barrier is formed in the at least one opening, an etch can be used to remove the diffusion barrier from atop the first interconnect metal structure 12 prior to proceeding to the next steps of the present application.

Figure 5:
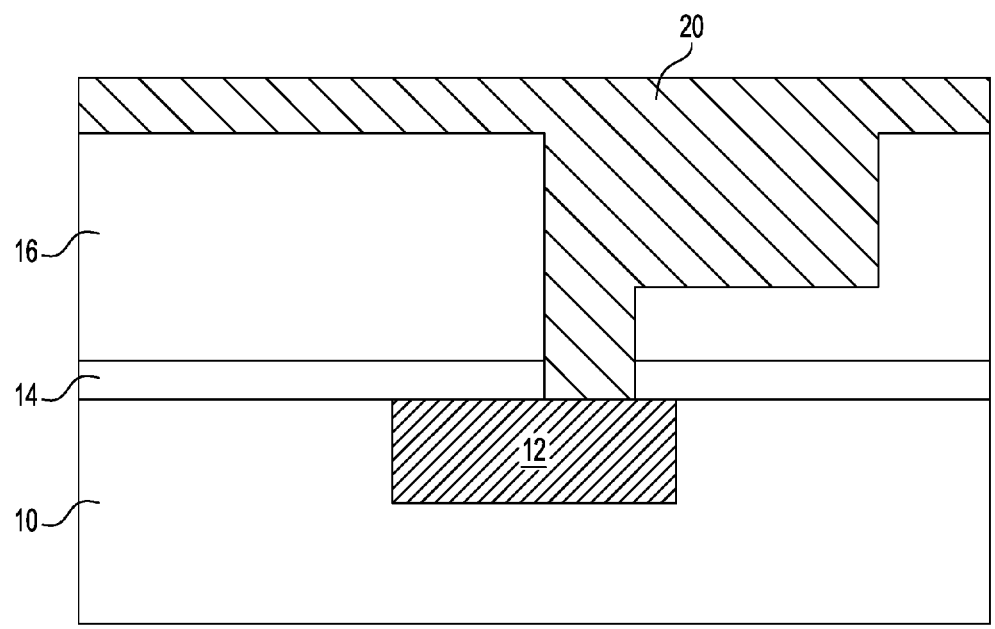
FIG. 5 is a cross sectional view of the exemplary semiconductor structure of FIG. 4 after forming a metallic blocking material in the at least one opening and on the exposed portion of the topmost surface of the at least one first interconnect metal structure in accordance with an embodiment of the present application.

Referring now to FIG. 5, there is illustrated the exemplary semiconductor structure of FIG. 4 after forming a metallic blocking material 20 in the at least one opening 18 and on the exposed portion of the topmost surface of the at least one first interconnect metal structure 12 in accordance with an embodiment of the present application. As is shown in the illustrated embodiment, surfaces of the metallic blocking material 20 directly contact surfaces of the second interconnect dielectric layer 16 that are exposed within the at least one opening 18. Thus and in the illustrated embodiment, no diffusion barrier material such as TaN is formed within the at least one opening 18 prior to forming the metallic blocking material 20.

The metallic block material 20 that can be employed in the present application includes any metal or metal stack that: (i) can prevent ion flow of a conductive metal(s) used to provide the first interconnect metal structure 12 and the second interconnect metal structure 22 (to be subsequently formed in the at least opening 18), (ii) has a resistivity that is lower than the conductive metal-containing materials used to provide the first interconnect metal structure 12 and the second interconnect metal structure 22, and (iii) provides good adhesion to Cu or other conductive metal-containing materials that are used in providing the first and second interconnect metal structures (12, 22). In one example, the resistivity of the metal or metal stack that can be used to provide the metallic block material 20 can be 25 micro-ohms-cm or less. In another embodiment, the resistivity of the metal or metal stack that can be used to provide the metallic block material 20 can be in a range from 3 micro-ohms-cm to 10 micro-ohms-cm. Examples of metals that can be used as the metallic block material 20 include, but are not limited to, W, Mo, Os, Ir, Ru, Rh or alloys thereof, for example, a W—Mo alloy.

The metallic blocking material 20 can be formed utilizing a non-selective deposition process such as, for example, physical vapor deposition. As is shown, the metallic blocking material 20 completely fills in the at least opening 18, including the opening provided in the optional dielectric capping layer 14, and has a portion that extends above and outside the at least one opening 18.

Figure 6:
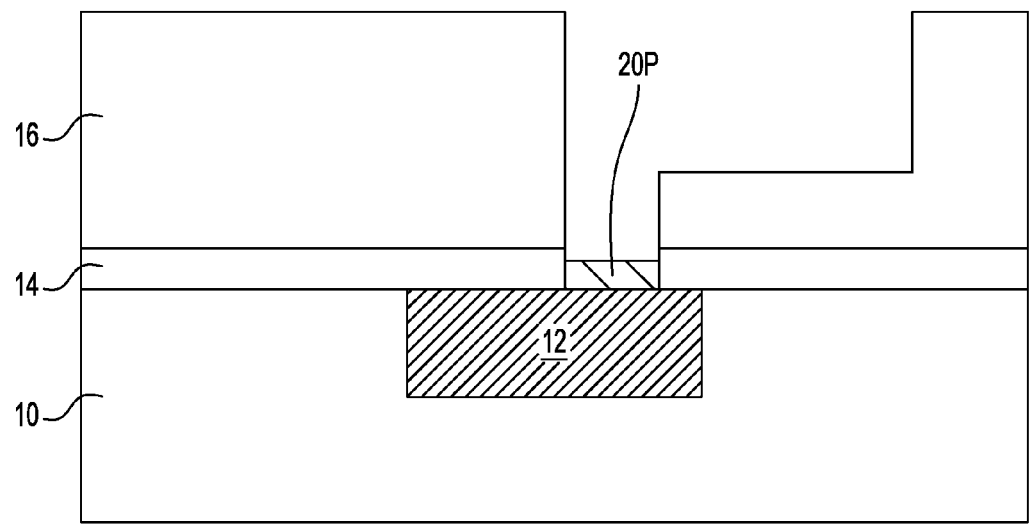
FIG. 6 is a cross sectional view of the exemplary semiconductor structure of FIG. 5 after recessing the metallic block material to provide a metallic blocking layer within a lower portion of the at least one opening and on the exposed portion of the topmost surface of the at least one first interconnect metal structure in accordance with an embodiment of the present application.

Referring now to FIG. 6, there is illustrated the exemplary semiconductor structure of FIG. 5 after recessing the metallic block material 20 to provide a metallic blocking layer 20P within a lower portion of the at least one opening 18 and on the exposed portion of the topmost surface of the at least one first interconnect metal structure 12 in accordance with an embodiment of the present application. In the illustrated embodiment, the metallic blocking layer 20P can formed by removing portions of the metallic blocking material 20 utilizing an etch back process that is selective in removing metal as compared to dielectric material. In some embodiments, a planarization process such as, for example, chemical mechanical polishing (CMP) may be performed prior to performing the etch back process. The metallic blocking layer 20P has a thickness from 1 nm to 10 nm. Other thicknesses that are lesser than, or greater than, the aforementioned thickness range can also be used in the present application as the thickness of the metallic blocking layer 20P.

In some embodiments of the present application, the metallic blocking layer 20P can be formed directly within the lower portion of the at least one opening 18 utilizing a selective deposition process such as, for example, chemical vapor deposition, atomic layer deposition or electroless deposition. In such an instance, the steps of metallic block material 20 formation, and recessing of the metallic blocking material 20 are avoided.

Figure 7:
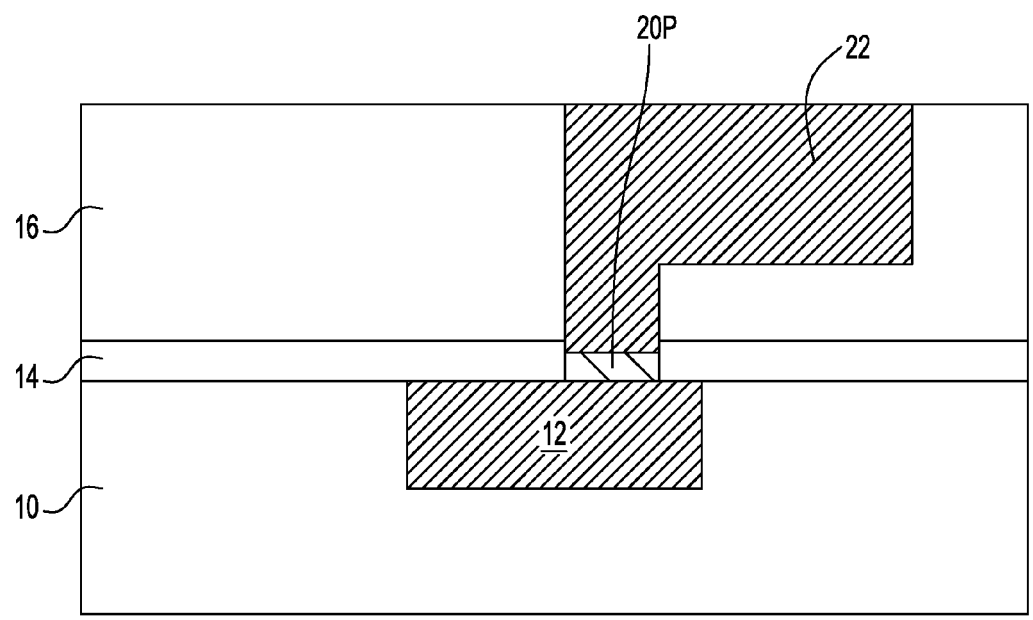
FIG. 7 is a cross sectional view of the exemplary semiconductor structure of FIG. 6 after forming a second interconnect metal structure in a remaining volume of the at least one opening in accordance with an embodiment of the present application.

Referring now to FIG. 7, there is illustrated the exemplary semiconductor structure of FIG. 6 after forming a second interconnect metal structure 22 in a remaining volume of the at least one opening 18 in accordance with an embodiment of the present application. In the illustrated embodiment, no diffusion barrier is formed within the remaining volume of the opening between the steps of metallic blocking layer 20P formation and second interconnect metal structure 22 formation. The second interconnect metal structure 22 can include one of the conductive metal-containing materials mentioned above for the first interconnect metal structure 12. In one embodiment, the first and second interconnect metal structures (12, 22) include a same conductive metal-containing material such, as for example, Cu or a Cu-alloy. In another embodiment, the first interconnect metal structure 12 is composed of a different conductive metal-containing material than the second interconnect metal structure 22. For example, the first interconnect metal structure 12 is composed of Cu, while the second interconnect metal structure 22 is composed of a Cu—Al alloy.

The second interconnect metal structure 22 can be formed by deposition of a conductive metal-containing material. A planarization process such as CMP may follow the deposition process. As shown, the second interconnect structure 22 has a topmost surface that is coplanar with a topmost surface of the second interconnect dielectric layer 16. In the illustrated embodiment and within the at least one opening 18, the second interconnect metal structure 22 directly contacts the exposed surfaces of the second interconnect dielectric layer 16. The second interconnect metal structure 22 has a bottommost surface that is separated from a topmost surface of the first interconnect metal structure 12 by the entire thickness of the metallic blocking layer 20P. In the embodiment illustrated, the metallic blocking layer 20P can be formed in a lower portion of a via opening. Collectively, the second interconnect dielectric layer 16 containing the second interconnect metal structure 22 embedded therein provides another interconnect level of the interconnect structure of the present application.

Figure 8:
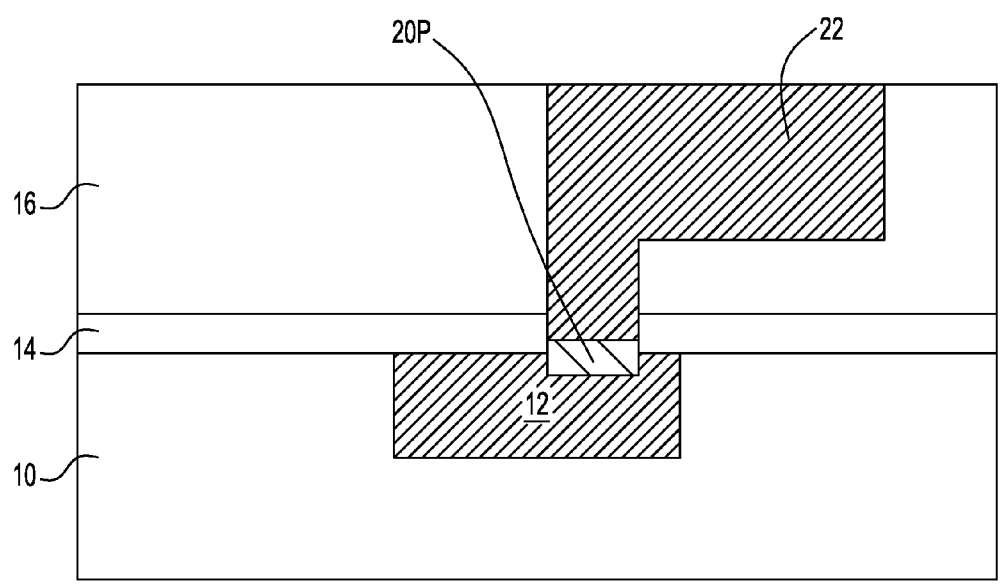
FIG. 8 is a cross sectional view of another exemplary semiconductor structure that can be formed utilizing the basic processing steps of the present application in which a gouging feature is formed into the first interconnect metal structure prior to forming the metallic blocking layer and the second interconnect metal structure.

Referring now to FIG. 8, there is illustrated another exemplary semiconductor structure that can be formed utilizing the basic processing steps of the present application in which a gouging feature is formed into the first interconnect metal structure 12 prior to forming the metallic blocking layer 20P and the second interconnect metal structure 22. The exemplary semiconductor structure shown in FIG. 8 can be formed by first providing a via opening within the second interconnect dielectric layer 16 and within the dielectric capping layer 14 shown in FIG. 3. Such a structure is then exposed/bombarded with a gaseous ion plasma (e.g., Ar, He, Ne, Xe, $N_2$, $H_2$, or $NH_3$) which partially removes a portion of the exposed first interconnect metal structure 12. Processing as described in FIGS. 4-7 can then be performed to provide the exemplary semiconductor structure shown in FIG. 8. As shown, the second interconnect structure 22 has a topmost surface that is coplanar with a topmost surface of the second interconnect dielectric layer 16. In the illustrated embodiment and within the at least one opening 18, the second interconnect metal structure 22 directly contacts the exposed surfaces of the second interconnect dielectric layer 16. The second interconnect metal structure 22 has a bottommost surface that is separated from a surface of the gouged first interconnect metal structure 12 by the entire thickness of the metallic blocking layer 20P. In the illustrated embodiment, the metallic blocking layer 20P is present on a gouged surface of the first interconnect metal structure 12.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a first interconnect dielectric layer containing a first interconnect metal structure embedded therein, wherein a topmost surface of said first interconnect metal structure is coplanar with a topmost surface of said first interconnect dielectric layer;
    a second interconnect dielectric layer containing a second interconnect metal structure embedded therein and located atop the first interconnect dielectric layer; and
    a metallic blocking layer having a lower resistivity than said first and second interconnect metal structures and separating a bottommost surface of said second interconnect metal structure from a surface of said first interconnect metal structure, wherein an entirety of a topmost surface of said metallic blocking layer is in direct physical contact with said bottommost surface of said second interconnect metal structure, and wherein no diffusion barrier liner separates said second interconnect metal structure from portions of said second interconnect dielectric layer.

2. The semiconductor structure of claim 1, wherein said metallic blocking layer comprises a metal or metal stack.

3. The semiconductor structure of claim 1, wherein said resistivity of said metallic blocking layer is 25 micro-ohms-cm or less.

4. The semiconductor structure of claim 1, wherein said resistivity of said metallic blocking layer is in a range from 3 micro-ohms-cm to 10 micro-ohms-cm.

5. The semiconductor structure of claim 1, wherein said metallic blocking layer comprises W, Mo, Os, Ir, Ru, Rh or alloys thereof.

6. The semiconductor structure of claim 1, wherein said metallic blocking layer is present between a bottommost surface of said second interconnect metal structure and a topmost surface of said first interconnect metal structure.

7. The semiconductor structure of claim 1, wherein said metallic blocking layer is present in a gouging feature provided in said first interconnect metal structure.

8. The semiconductor structure of claim 1, wherein said first and second interconnect metal structures comprise Cu, and said metallic blocking layer comprises a metal or metal stack that has a lower resistivity than Cu.

9. The semiconductor structure of claim 1, further comprising a dielectric capping layer located between a portion of said first interconnect dielectric layer and said second interconnect dielectric layer.

10. The semiconductor structure of claim 1, wherein said metallic blocking layer has sidewall surfaces that do not extend to sidewall surfaces of said first interconnect metal structure.

11. A semiconductor structure comprising:
    a first interconnect dielectric layer containing a first interconnect metal structure embedded therein;
    a second interconnect dielectric layer containing a second interconnect metal structure embedded therein and located atop the first interconnect dielectric layer; and
    a metallic blocking layer having a lower resistivity than said first and second interconnect metal structures and separating a surface of said second interconnect metal structure from a surface of said first interconnect metal structure, wherein said metallic blocking layer contains sidewall surfaces that are vertically aligned with sidewall surfaces of a lower portion of said second interconnect metal structure, and wherein no diffusion barrier liner separates said second interconnect metal structure from portions of said second interconnect dielectric layer.

* * * * *